US010920098B2

(12) United States Patent
Van Der Meulen et al.

(10) Patent No.: US 10,920,098 B2
(45) Date of Patent: Feb. 16, 2021

(54) PROCESSING OF POLYMER BASED INKS AND PASTES

(71) Applicant: HENKEL AG & CO. KGAA, Duesseldorf (DE)

(72) Inventors: Inge Van Der Meulen, MJ Veldhoven (NL); Gunther Dreezen, Balen-Olmen (BE); Anja Henckens, Zonhoven (BE); Stijn Gillissen, Hasselt (BE); Rudolf Warmold Oldenzijl, Hoogezand (NL)

(73) Assignee: HENKEL AG & CO. KGAA, Duesseldorf (DE)

( * ) Notice: Subject to any disclaimer, the term of this patent is extended or adjusted under 35 U.S.C. 154(b) by 0 days.

(21) Appl. No.: 16/270,947

(22) Filed: Feb. 8, 2019

(65) Prior Publication Data
US 2019/0169457 A1 Jun. 6, 2019

Related U.S. Application Data

(63) Continuation of application No. PCT/EP2017/068828, filed on Jul. 26, 2017.

(30) Foreign Application Priority Data

Aug. 11, 2016 (EP) .................................. 16183752

(51) Int. Cl.
*C09D 11/52* (2014.01)
*H01L 31/02* (2006.01)
(Continued)

(52) U.S. Cl.
CPC ............... *C09D 11/52* (2013.01); *C09D 5/24* (2013.01); *C09D 11/033* (2013.01);
(Continued)

(58) Field of Classification Search
None
See application file for complete search history.

(56) References Cited

U.S. PATENT DOCUMENTS

2003/0178221 A1   9/2003   Chiu et al.
2010/0294353 A1  11/2010   Takahashi
(Continued)

FOREIGN PATENT DOCUMENTS

| EP | 1594351 A2 | 11/2005 |
| EP | 1993144 A1 | 11/2008 |
| WO | 2016024793 A2 | 2/2016 |

OTHER PUBLICATIONS

Schroder, K. A. et al. "Broadcast Photonic Curing of Metallic Nanoparticle Films" NSTI-Nanotech 2006, vol. 3, pp. 198-201.

*Primary Examiner* — Asok K Sarkar
(74) *Attorney, Agent, or Firm* — Steven C. Bauman

(57) ABSTRACT

The present invention relates to a process of forming electrical conductor on a substrate comprising the steps of a) providing a substrate; b) providing an electrically conductive composition; c) applying said electrically conductive composition to at least one part of said substrate; and d) exposing said electrically conductive composition on the substrate to a near infrared light to form an electrical conductor. NIR light cure provides improved electrical properties of the cured composition without damaging heat sensitive substrates.

9 Claims, 4 Drawing Sheets

(51) Int. Cl.
    *C09D 5/24*       (2006.01)
    *C09D 11/033*     (2014.01)
    *C09D 11/037*     (2014.01)
    *C09D 11/103*     (2014.01)
    *C09D 11/322*     (2014.01)
    *C09D 11/36*      (2014.01)
    *C09D 161/06*     (2006.01)

(52) U.S. Cl.
    CPC .......... *C09D 11/037* (2013.01); *C09D 11/103* (2013.01); *C09D 11/322* (2013.01); *C09D 11/36* (2013.01); *C09D 161/06* (2013.01); *H01L 31/02008* (2013.01)

(56) References Cited

U.S. PATENT DOCUMENTS

| | | |
|---|---|---|
| 2014/0367619 A1 | 12/2014 | Summers |
| 2015/0299478 A1* | 10/2015 | Sente ............... C09D 11/52 174/268 |
| 2016/0155868 A1 | 6/2016 | Takahashi et al. |
| 2017/0040472 A1* | 2/2017 | Takahashi ........... H01L 31/0256 |

* cited by examiner

PROCESSING OF POLYMER BASED INKS AND PASTES

FIELD OF THE INVENTION

The present invention relates a process of forming electrical conductor on a substrate comprising the steps of a) providing a substrate; b) providing an electrically conductive composition; c) applying said electrically conductive composition to at least one part of said substrate; and d) exposing said electrically conductive composition on the substrate to a near infrared (NIR) light to form an electrically conductive pathway. NIR light cure provides improved electrical properties of the cured composition without damaging heat sensitive substrates in a very short time.

BACKGROUND OF THE INVENTION

Electrical conductors are formed on the substrate by printing or otherwise applying a conductive composition on to a surface of a substrate and curing the applied composition. Printed conductive inks and pastes, which are deposited on the delicate surfaces, are often difficult to cure and/or sinter because of their relative high curing temperatures. These high curing temperatures are not often compatible with delicate substrates used.

One currently used curing technique in the printing process of the printed electronics is cure or drying in a box-oven process. Box-oven curing/drying technique is time consuming technique. Full cure/dryness may take up to one hour with box-oven technique.

An alternative for the box-oven cure technique, is IR drying/curing, which is used more and more. IR cure is effective and a relative fast curing technique. IR drying/curing technique can be used in-line in a roll-to-roll manufacturing process, and is already much faster regarding drying/curing time. However, this technique increases the temperature of the substrates very intensely, which can be detrimental to the delicate substrates.

Another currently used curing technique is a photonic flash, which is a fast curing technique. However, it is not possible to use this technique alone for high solvent based systems. For the flash cure technique, the solvents need to be evaporated. This solvent removal can be done by conventional box-oven drying or IR drying, which is as mentioned above, time consuming and/or may be detrimental to the delicate substrate.

Therefore, there is still a need for a curing/drying technique to provide fast drying/cure without damaging the delicate substrate in the process.

SUMMARY OF THE INVENTION

Figure 1:
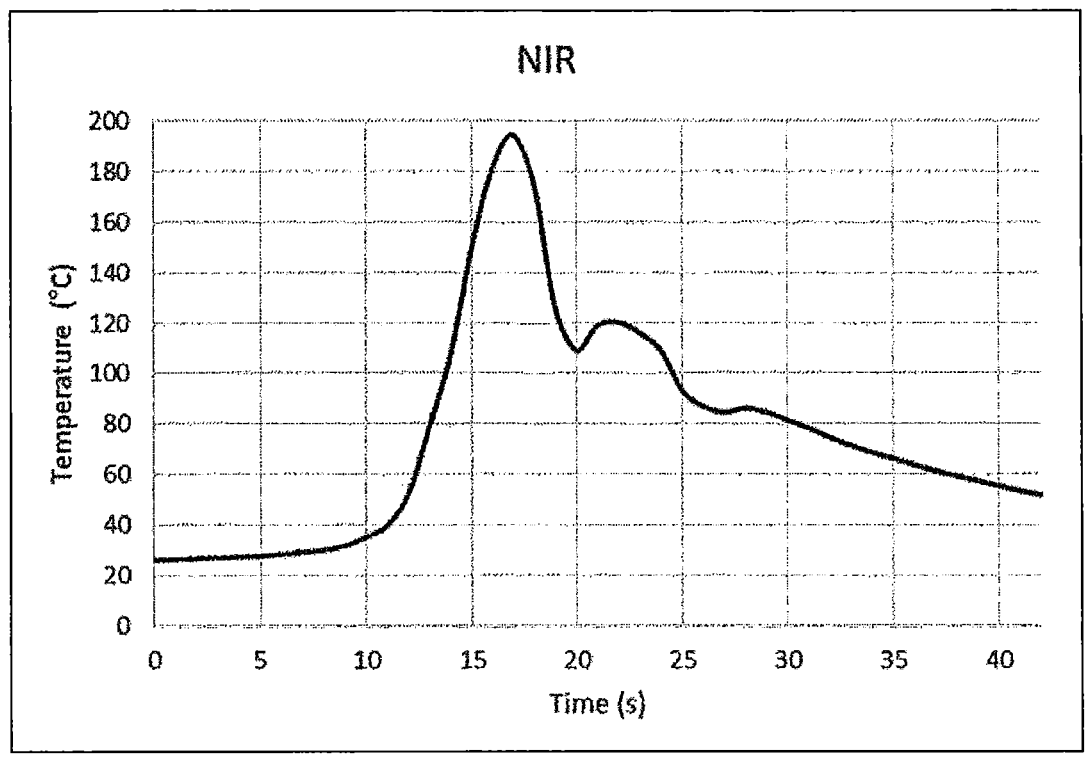
FIG. 1 illustrates a temperature profile on substrate with NIR cure.

The present invention relates to a process of forming an electrical conductor on a substrate comprising the steps of a) providing a substrate; b) providing an electrically conductive composition; c) applying said electrically conductive composition to at least one part of said substrate; and d) exposing said electrically conductive composition on the substrate to a near infrared light to form an electrical conductor.

The present invention also relates to an electrical device comprising an electrical conductor formed by process according to the present invention. The electrical device can be a solar cell or solar module.

DETAILED DESCRIPTION OF THE INVENTION

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps.

The recitation of numerical end points includes all numbers and fractions subsumed within the respective ranges, as well as the recited end points.

All percentages, parts, proportions and then like mentioned herein are based on weight unless otherwise indicated.

When an amount, a concentration or other values or parameters is/are expressed in form of a range, a preferable range, or a preferable upper limit value and a preferable lower limit value, it should be understood as that any ranges obtained by combining any upper limit or preferable value with any lower limit or preferable value are specifically disclosed, without considering whether the obtained ranges are clearly mentioned in the context.

All references cited in the present specification are hereby incorporated by reference in their entirety.

Unless otherwise defined, all terms used in disclosing the invention, including technical and scientific terms, have the meaning as commonly understood by one of the ordinary skill in the art to which this invention belongs to. By means of further guidance, term definitions are included to better appreciate the teaching of the present invention.

In accordance with the present invention, there is provided a process of forming electrical conductor on a substrate wherein an electrically conductive composition is exposed to a near infrared light to form an electrical conductor.

Surprisingly the Applicant has discovered that the NIR cure technique does not only provide remarkably faster cure but also improves electrical properties of the cured composition.

The present invention relates to a process of forming an electrical conductor on a substrate comprising the steps of: a) providing a substrate; b) providing an electrically conductive composition; c) applying said electrically conductive composition to at least one part of said substrate; and d) exposing said electrically conductive composition on the substrate to a near infrared light to form an electrical conductor.

A process according to the present invention is directed to form an electrical conductor on a surface of wide variety of substrates, especially heat sensitive substrates. Material forming an electrical conductor have typically high drying/curing temperature, and therefore, substrates are exposed to the elevated temperatures for a long period of time during curing/drying step. This may be detrimental to heat sensitive substrates.

Suitable substrates for use in the process according to the present invention are selected from the group consisting of plastics; polyethylene terephthalate; polyethylene; polyimide; polyvinylchloride; polystyrene; polyurethane; polycarbonate; textile; paper; cardboard; printed circuit boards (PCB) such as FR4 (formed from epoxy resin, woven glass fabric reinforcement and brominated flame retardant), FR5, HDI and any other type of epoxy or phenolic glass filler reinforced laminates; silicon wafers; transparent conductive oxide coated substrates and mixtures thereof.

The process according to the present invention involves applying the electrically conductive composition to at least one part of the substrate.

The electrically conductive composition can be applied onto the surface of the substrate by any suitable method. Preferably, the electrically conductive composition is applied by the method selected from the group consisting of screen printing, flexo gravure printing, roto gravure printing, off-set printing, roto-screen printing, gravure printing, inkjet printing, stencil printing, jet-dispensing, auger-valve dispensing, time-pressure dispensing, slot-die coating, laser induced forward transfer, pin-transfer, roll coating, comma coating, more preferably method is selected from the group consisting of flexo printing, roto screen printing, screen printing, stencil printing and gravure printing.

The composition is applied on to at least one part of the substrate. The composition may cover whole surface of the substrate, or only a part of it. The composition may cover one specific area of the surface of the substrate, or it may cover symmetrical or asymmetrical patterns. Example of symmetrical patterns are finger and bus bar elements on the surface of the solar cells. Also any type of printed RFID antenna can benefit from the process according to the present invention.

The process according to the present invention includes exposing the electrically conductive composition on the substrate to a near infrared light to cure the electrically conductive composition in order to form an electrical conductor. It has been discovered that the NIR cure does not only provide remarkably faster cure, but also improves electrical properties of the cured composition.

Figure 2:
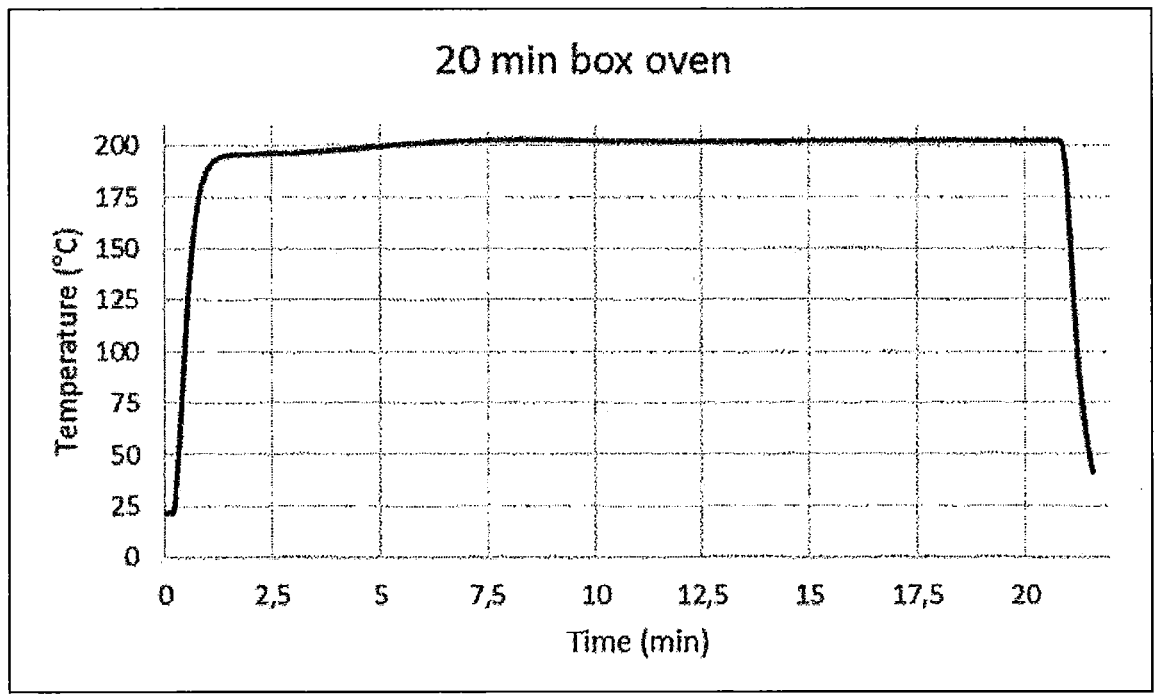
FIG. 2 illustrates a temperature profile with box-oven cure.
Figure 3:
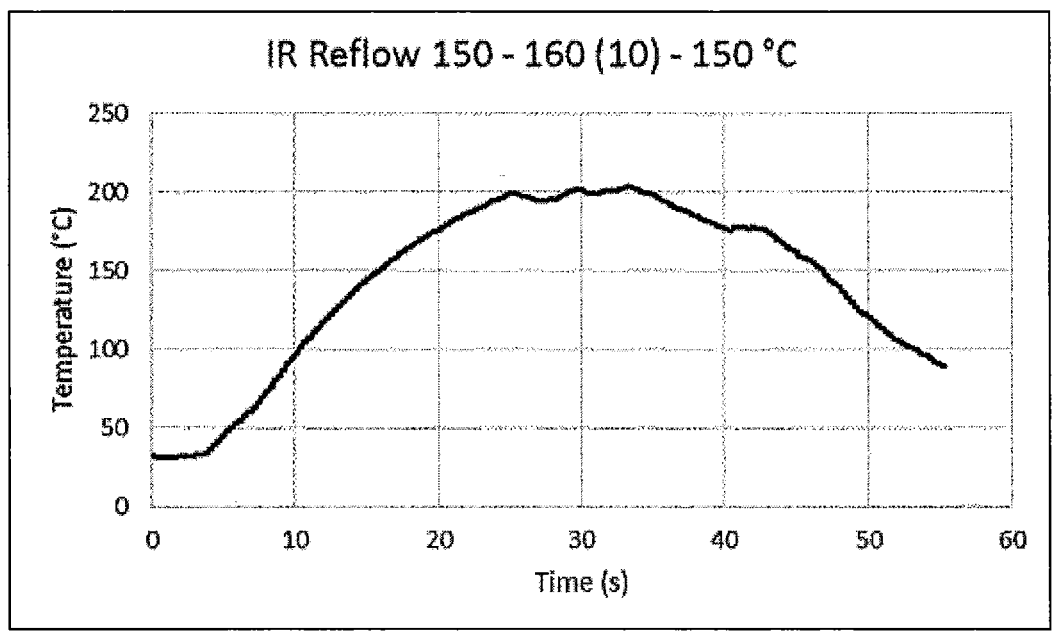
FIG. 3 illustrates a temperature profile with IR reflow cure.

The full cure can be reached in a very short time by using a NIR light source. The temperature of the substrate raises for the maximum temperature only for a short period of time, and therefore, the NIR cure technique is not detrimental to the delicate surfaces. Temperature curve of the temperature of the substrate during the NIR cure is illustrated in FIG. 1. The curve illustrates that the maximum substrate temperature is only for a few seconds. As a comparison, temperature curves for the box-oven and IR techniques are illustrated in FIGS. 2 and 3. The curves illustrates that the maximum substrate temperature is for several seconds, close to a minute for IR cure and several minutes for box-oven cure.

In the process according to the present invention, the electrically conductive composition on at least part of a substrate is exposed to a near infrared light for 30 seconds, preferably for 20 seconds and more preferably 10 seconds.

NIR light used in the process according to present invention has a wavelength between 350-2250 nm, with peak wavelength around 750 nm.

The intensity of the NIR light depends on the lamp used. Different suppliers might supply lamps with different intensity. Particularly preferred lamp to be used in the present invention is Adphos U-emitter. Example of commercially available NIR light suitable for use in the present invention is Adphos U emitter NB 18-250 from Adphos Innovative Technologies GmbH.

The process according to the present invention may further comprise a drying step carried out before exposing said electrically conductive composition on the substrate to a near infrared light. Drying can be done with any conventional methods.

An electrically conductive composition suitable for use in the process according to the present invention is in a form of a paste or an ink. The suitable electrically conductive composition may comprise a resin, electrically conductive particles, a solvent and additional additives.

A typical electrically conductive ink (ECI) composition suitable for use in the process according to the present invention to form an electrical conductor comprises a resin from 0.5 to 15% by weight of the total weight of the composition, preferably from 1.0 to 10%; electrically conductive particles from 15 to 75% by weight of the total weight of the composition, preferably from 45 to 65%; and one or more organic solvent from 15 to 70% by weight of the total weight of the composition, preferably from 25 to 40%. Suitable electrically conductive ink (ECI) composition may further comprise additives from 0 to 5% by weight of the total weight of the composition, preferably from 0.1 to 3%.

A typical electrically conductive paste (ECP) composition suitable for use in the process according to the present invention to form an electrical conductor comprises a resin from 0 to 15% by weight of the total weight of the composition, preferably from 0.1 to 15%, more preferably from 1 to 12%; electrically conductive particles from 45 to 97% by weight of the total weight of the composition, preferably from 60 to 95%. Suitable electrically conductive paste (ECP) composition may further comprise one or more organic solvent from 0 to 20% by weight of the total weight of the composition, preferably from 0.1 to 5%; and additives from 0 to 5% by weight of the total weight of the composition, preferably from 0.1 to 3%.

A typical electrically conductive composition suitable for use in the process according to the present invention may comprise a resin. A typical electrically conductive ink (ECI) composition suitable for use in the process according to the present invention comprises a resin. Electrically conductive paste (ECP) may comprise a resin, but as an optional ingredient.

Suitable resin for use in the present invention can be a thermoset or a thermoplastic resin.

Suitable thermoplastic resins for use in the present invention can be selected from the group consisting of thermoplastic polyurethanes, polyesters, polyacrylates, polysiloxanes, halogenated vinyl or vinylidene polymers, polyamide copolymers, phenoxy resins, polyethers, polyketones, polyvinyl butyral, polyvinyl pyrrolidone, polyacrylates, polyimides, polyols, cellulose and mixtures thereof.

Suitable thermoset resins for use in the present invention can be selected from the group consisting of epoxide, silicones, acrylates, BMI, benzoxazines, cyanate esters, olefins, phenolic resins, oxetanes, vinyl ethers and mixtures thereof.

An electrically conductive composition suitable for use in the process according to the present invention may comprise a solvent. A typical electrically conductive ink (ECI) composition suitable for use in the process according to the present invention comprises a solvent. Electrically conductive paste (ECP) may comprise a solvent, but as an optional ingredient.

Suitable solvent for use in the present invention can be selected from the group consisting of alcohols, ketones, esters, glycol esters, glycol ethers, ethers, acetates, carbonates and mixtures thereof. Preferably, a solvent is selected from the group consisting of dipropylene glycol, ethylene glycol, diethylene glycol, triethylene glycol, hexylene glycol, 1-methoxy-2-propanol, diacetone alcohol, 2-ethyl-1,3-hexanediol, tridecanol, 1,2-octanediol, butyldiglycol, alpha-terpineol or beta-terpineol, 2-(2-butoxyethoxy)ethyl acetate, 2,2,4-trimetyl-1,3-pentanediol diisobutyrate, 1,2-propylene carbonate, carbitol acetate, butyl carbitol acetate, butyl carbitol, ethyl carbitol acetate, 2-phenoxy ethanol, hexylene glycol, dibutylphthalate, dibasic ester (DBE), dibasic ester 9 (DBE-9), dibasic ester 7 (DBE-7) and mixtures thereof.

A typical electrically conductive ink (ECI) or paste (ECP) composition suitable for use in the process according to the present invention comprises electronically conductive material. Suitable electronically conductive material for use in the present invention can be selected from the group consisting of silver, nickel, carbon, carbon black, graphite, graphene, copper, indium, indium alloys, gold, platinum, aluminum, iron, zinc, cobalt, lead, tin alloys, silver coated fillers such as silver coated copper, silver coated graphite, silver coated polymers and mixtures thereof.

A typical electrically conductive ink (ECI) or paste (ECP) composition suitable for use in the process according to the present invention may further comprise a curing agent. Especially, when the selected resin is a thermoset, a curing agent is present in the composition.

Suitable curing agents for use in the present invention are any type of curing agents to initiate the reaction when heated, regardless of the possible cure mechanism. Examples of suitable curing agents for use in the present invention are any type of amide or amine—including epoxy-amine adducts, imidazoles, piperazines, piperidines, pyrazoles, purines, triazoles; dicarboxylic acids; anhydrides; mercaptanes; thiols; polysulfides; a lewis acid or salt, typically $SbF_6$ or $PF_6$ based iodonium or sulfonium salts, which create a super acid upon initiation/activation to trigger cure are used; peroxides; azo compounds, which dissociate upon heating and mixtures thereof.

Typical electrically conductive ink (ECI) or paste (ECP) composition suitable for use in the process according to the present invention may further comprise one or more additive. Suitable additive for use in the present invention can be selected from the group consisting of rheological additives, wetting agents, dispersing agents, defoamers, adhesion promotors, anti-corrosion agents, inhibitors, stabilizers, fluxing agents, surfactants and mixtures thereof.

In one embodiment, an electrically conductive ink composition suitable for use in the process according to the present invention comprises,
a) from 0.5 to 15 wt.-% of resin;
b) from 15 wt.-% to 75 wt.-% of electrically conductive silver particles; and
c) from 10 to 70 wt.-% of one or more organic solvents,
wherein all wt. % are based on the total weight of the composition.

In another embodiment an electrically conductive ink composition suitable for use in the process according to the present invention comprises,
a) from 0.5 to 15 wt.-% of resin;
b) from 15 wt.-% to 75 wt.-% of electrically conductive silver particles;
c) from 15 to 70 wt.-% of one or more organic solvents; and
d) from 0.01 to 3 wt.-% of one or more additives,
wherein all wt. % are based on the total weight of the composition.

In one embodiment an electrically conductive paste composition suitable for use in the process according to the present invention comprises,
a) from 0 to 15 wt.-% of resin, preferably from 0.1 to 15 wt. %; and
b) from 45 wt.-% to 97 wt.-% of electrically conductive silver particles,
wherein all wt. % are based on the total weight of the composition.

In another embodiment an electrically conductive paste composition suitable for use in the process according to the present invention comprises,
a) from 0 to 15 wt.-% of resin, preferably from 0.1 to 15 wt. %;
b) from 45 wt.-% to 97 wt.-% of electrically conductive silver particles;
c) from 0.1 to 15 wt.-% of one or more organic solvents, and
d) from 0.01 to 3 wt.-% of one or more additives,
wherein all wt. % are based on the total weight of the composition.

The present invention relates to an electrical device, which comprises an electrical conductor formed by the process according to the present invention. The electrical device can be high speed printed electronic device. The electrical device can be any device comprising a printed circuit. More specifically, the electrical device can be a solar cell or solar module, which comprises an electrical conductor formed by the process according to the present invention.

EXAMPLES

The examples described hereunder exemplify the properties of the compositions according to the embodiments of the present invention. Unless otherwise indicated, all parts and percentages in following examples, as well as throughout the description, are parts by weight or percentages by weight respectively.

The following examples are included for purposes of illustration so that the disclosure may be more readily understood and are in no way to be intended to limit the scope of the disclosure unless otherwise specifically indicated.

Example 1

| Raw material | Example 1 - ECI |
| --- | --- |
| Phenoxy resin (PKHH) | 10.184 |
| Phenolic resin in solvent (PF 9132 KP) | 0.359 |
| Carbitol Acetate | 28.138 |
| Ag flake (GA238-11) | 61.319 |

Phenoxy resin PKHH from InChem; Phenolic resin in solvent PF9132KP from Momentive; Ag flake GA238-11 from Metalor.

Example 2

| Raw material | Example 2 - ECP |
| --- | --- |
| Ag flake (FA-S-6) | 88.10 |
| Propylene carbonate | 11.450 |
| Luperox 10 | 0.440 |

Ag flake FA-S-6 from DOWA; Ag flake GA238-11 from Metalor; Luperox 10 From Sigma Aldrich.

Example 3

| Raw material | Example 3 - ECI |
| --- | --- |
| Disperbyk 110 | 0.550 |
| DBE-9 | 21.150 |
| Saran F-310 | 6.900 |
| Ag flake (AA 3462) | 54.520 |
| Butyl glycol acetate | 16.990 |
| Estane 5715 | 0.890 |

Disperbyk 110 from BYK Chemie; DBE-9 from Invista; Saran F-310 from Asahi Kasei; Ag flake AA 3462 from Metalor, Estane 5715 from Lubrizol.

Example 4

| Raw material | Example 4 - ECI |
| --- | --- |
| Resin | 1.34 |
| Carbitol acetate | 3.28 |
| Silver | 94.69 |
| Crayvallac Super | 0.69 |

Crayvallac Super from Arkema.

Example 5

| Raw material | Example 5 - ECP |
| --- | --- |
| Phenoxy resin | 1.58 |
| Carbitol acetate | 4.40 |
| Epoxy resin 1 | 1.80 |
| Curing agent | 0.21 |
| Propylene carbonate | 0.21 |
| Epoxy resin 2 | 2.70 |
| Ag flake P 554-19 | 85.50 |
| Ag flake SAB 520 | 4.50 |

Phenoxy resin from InChem; Ag flake P 554-19 supplied by Metalor; Ag flake SAB 520 from DOWA.

Figure 4:
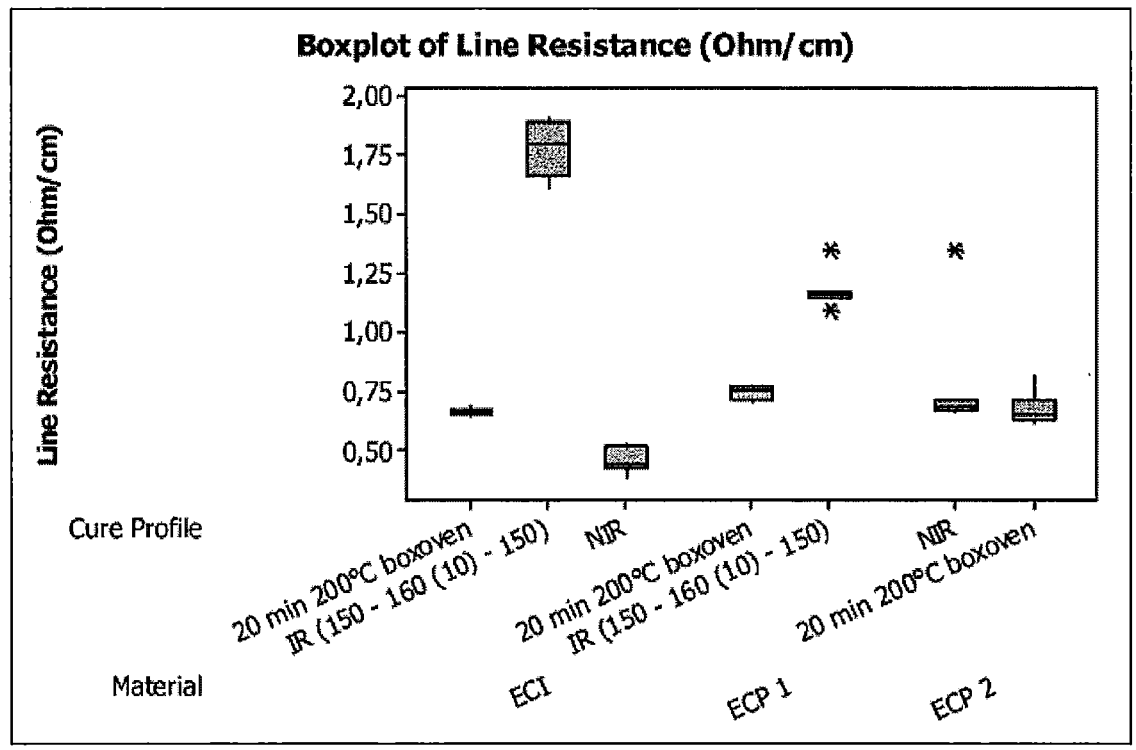
FIG. 4 illustrates a comparison of resistance values of ink and pastes obtained with different curing techniques.

FIG. 4 illustrates a comparison of resistance values of cured inks and pastes obtained with different curing techniques. Compositions were applied on the surface of the substrate (ITO coated silicon wafer) by screen printing. Applied compositions were exposed to NIR for 5-10 seconds and the compositions were dried or cured. In addition, additional samples of the same compositions were cured with conventional box-oven cure (20 minutes) and with IR cure (10 seconds). As the figure illustrates, the electrical properties are better with the compositions cured with NIR. At the same time, sintering of the compositions was observed when exposed to conventional box-oven cure for 20 minutes. Whereas, sintering was done within 10 seconds, with NIR cure. These results illustrate that process according to the present invention using NIR cure provides a very fast cure method, while ensuring optimal electrical properties. ECI is example 4 and ECP 1 and ECP 2 are variations of example 5.

Examples 5a and 5b

| Raw material | Example 5a - ECP1 | Example 5b - ECP2 |
| --- | --- | --- |
| Phenoxy resin | 1.58 | 1.58 |
| Carbitol acetate | 4.40 | 4.87 |
| Epoxy resin 1 | 1.80 | 1.80 |
| Curing agent | 0.21 | 0.21 |
| Propylene carbonate | 0.21 | 0.21 |
| Epoxy resin 2 | 2.70 | 2.70 |
| Ag flake P 554-19 | 85.50 | 94.89 |
| Ag flake SAB 520 | 4.50 | 5.00 |

Figure 5:
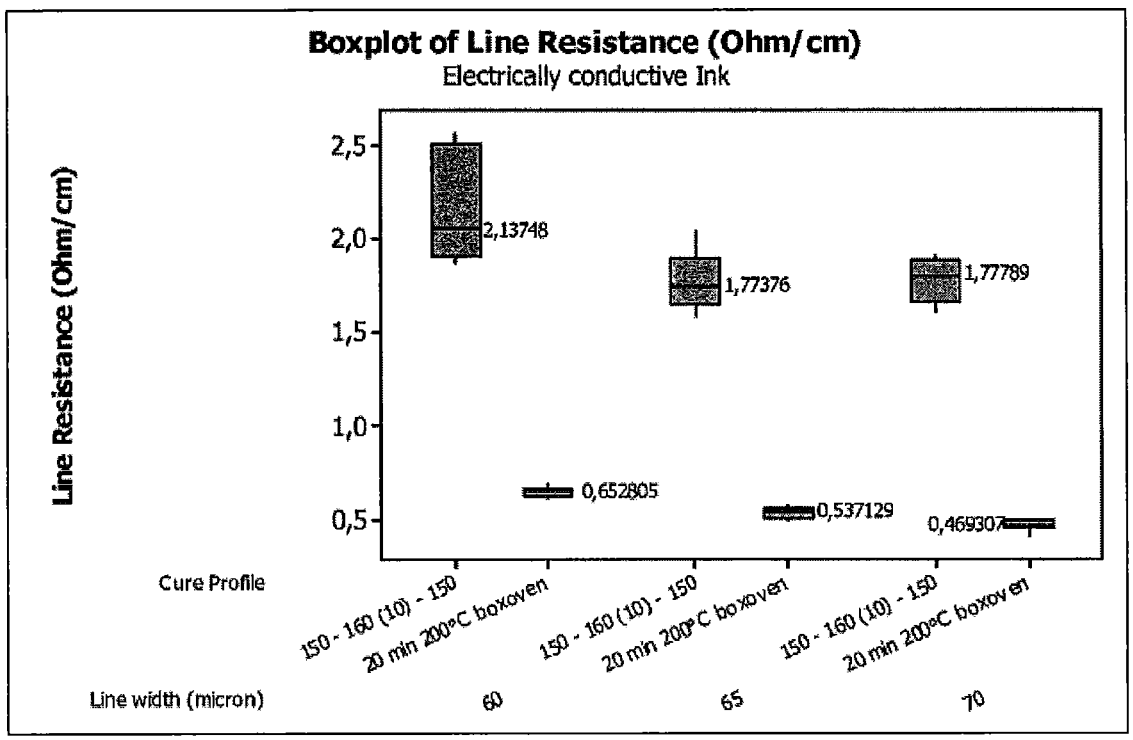
FIG. 5 illustrates comparison between IR cure and box-oven cure for an electrically conductive ink.
Figure 6:
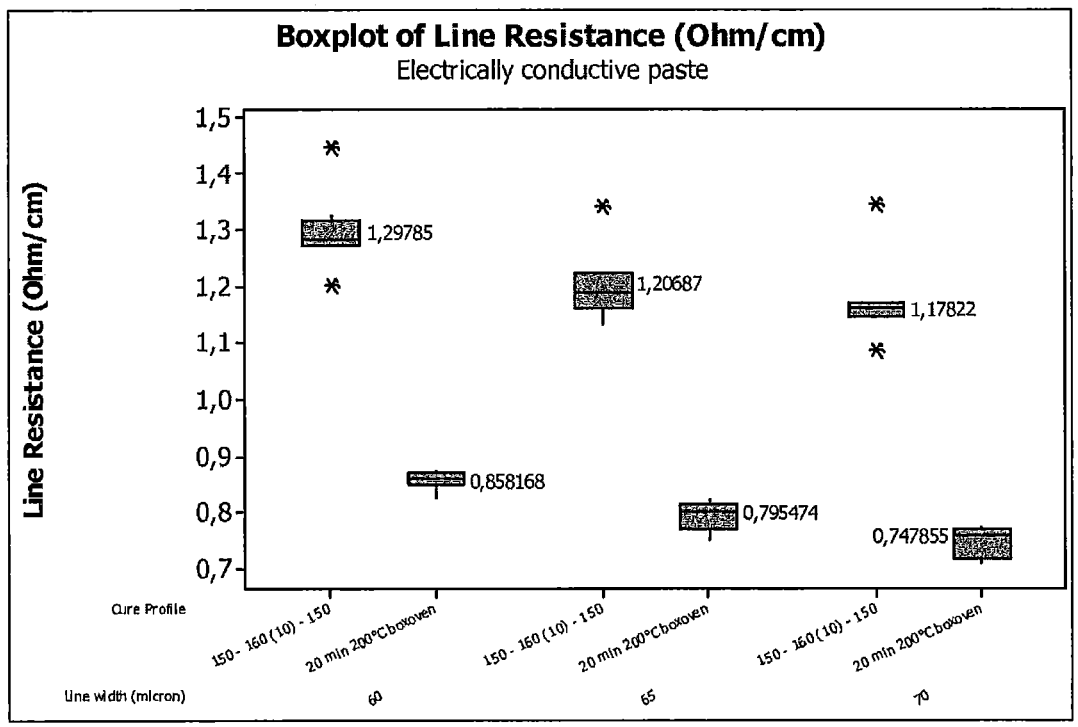
FIG. 6 illustrates comparison between IR cure and box-oven cure for an electrically conductive paste.

FIGS. 5 and 6 illustrate a comparison of resistance values of cured inks and pastes obtained with box-oven (20 minutes) and IR cure (10 seconds). Compositions were applied on the surface of the substrate (ITO coated silicon wafer) by screen printing and cured. Three different screen openings with different width were used i.e. 60 μm, 65 μm and 75 μm wide. Subsequently, the line resistance was calculated by dividing the resistance of the track (measured with 4-point probes) by the length of the track. The test results show that all line widths printed, the material cured with box-oven cure provides a much lower resistance than when the material is cured with IR at a much shorter time. This applies for both pastes and inks.

FIGS. 1, 2 and 3 illustrates temperature profile of the substrate during box-oven, IR and NIR cure. NIR cure exposures the substrate for a higher temperature only for a short period of time (few seconds), whereas both box-oven and IR cure methods both exposure the substrate for higher temperature for longer period of time (from few minutes to several minutes), which may be detrimental for the delicate substrate.

Temperature profiles were measured by fixating a thermocouple to the substrate (in this case an ITO coated silicon wafer) with heat resistant tape and run the curing profile. The thermocouple was connected with a PC and via PicoLog software the temperature profile was recorded.

Heat sensitive substrates as active solar cells and plastics for example, can withstand high temperatures for a short period of time. Therefore, process according to the present invention enables the use of very high conductive materials on these substrates without damaging the substrates.

Example 6

The cure step of the process according to the present invention can also be used as a post-processing step. This means that curable materials, which have already been cured with different techniques can be provided an additional NIR cure. The results exemplify that the additional NIR cure provides better conductivity of the material, and therefore, a better performance.

Figure 7:
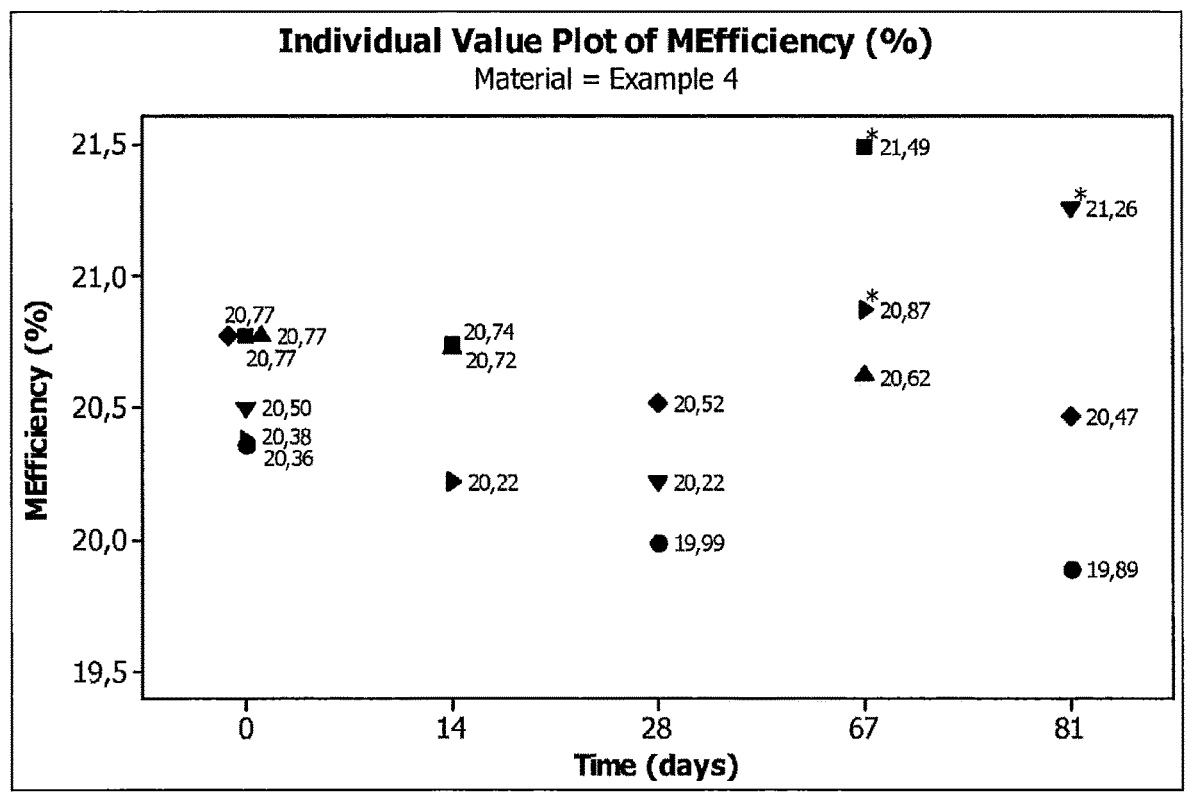
FIG. 7 illustrates an effect of post-cure with NIR on solar cell efficiency.

Solar cells were printed on day one and cured by using conventional box-oven cure technique. Composition of example 4 was used herein. The efficiency of the cells were measured over time. A slow drop in performance is visual (see FIG. 7, every symbol represents a different cell). After 67 days (two samples) and after 82 days (one sample) some of the cells (noted by the symbols with a star in the graph) were post-cured with NIR for 3.6 seconds. Subsequently, the cell efficiency was measured again, and found higher than initial cell efficiency. FIG. 7 illustrates these results.

Efficiency of the cells was measured with I-V testing. The test equipment used was a solar cell I-V tester from Industrial Vision Technology (S) Pte Ltd (Singapore) with a class AAA, constant lighting solar simulator.

The invention claimed is:

1. A process of forming an electrical conductor on a substrate comprising the steps of:
   a) providing a substrate selected from the group consisting of plastics, polyethylene terephthalate, polyethylene, polyimide, polyvinylchloride, polystyrene, polyurethane, textile, paper, cardboard, printed circuit boards (PCB), transparent conductive oxide coated substrates and mixtures thereof;
   b) providing an electrically conductive composition to at least a portion of said substrate, wherein said electrically conductive composition comprises electrically conductive particles in an amount of (i) between 15 wt. % to 75 wt. % or (ii) between 47 wt. % to 97 wt. %; and
   c) exposing said electrically conductive composition on the substrate to a near infrared light having a peak wavelength of around 750 nm to form an electrical conductor.

2. The process according to claim 1, wherein said process further comprises a drying step carried out before exposing said electrically conductive composition on the substrate to a near infrared light.

3. The process according to claim 1, wherein said electrically conductive composition on said substrate is exposed to a near infrared light for a maximum of 20 seconds.

4. The process according to claim 1, wherein said electrically conductive composition is applied on to the substrate by a method selected from the group consisting of screen printing, flexo gravure printing, roto gravure printing, off-set printing, roto-screen printing, gravure printing, inkjet printing, stencil printing, jet-dispensing, auger-valve dispensing, time-pressure dispensing, slot-die coating, laser induced forward transfer, pin-transfer, roll coating, and comma coating.

5. The process according to claim 1, wherein said electrically conductive composition is in a form of a paste or an ink.

6. The process according to claim 5, wherein said electrically conductive composition is an ink and comprises:
   a) from 0.1 to 15 wt. % of a resin;
   b) from 15 wt. % to 75 wt. % of electrically conductive particles; and
   c) from 10 to 70 wt. % of one or more organic solvents, wherein all wt. % are based on total weight of the composition.

7. The process according to claim 5, wherein said electrically conductive composition is a paste and comprises:
   a) from 0 to 15 wt. % of a resin; and
   b) from 45 wt. % to 97 wt. % of electrically conductive particles; and
   c) from 0 to 15 wt % of one or more organic solvents, wherein all wt. % are based on total weight of the composition.

8. An electrical device comprising electrical conductor formed by process according to claim 1.

9. The electrical device according to claim 8, wherein said electrical device is a solar cell or solar module.

* * * * *